United States Patent [19]

Stoemenos

[11] Patent Number: 5,352,492
[45] Date of Patent: Oct. 4, 1994

[54] ANNEALING PROCESS

[75] Inventor: John Stoemenos, Thessaloniki, Greece

[73] Assignee: Gec-Marconi Limited, United Kingdom

[21] Appl. No.: 33,130

[22] Filed: Mar. 18, 1993

[30] Foreign Application Priority Data

Mar. 20, 1992 [GB] United Kingdom ............ 9206084.7

[51] Int. Cl.⁵ ............................................. B05D 3/00
[52] U.S. Cl. ................................ 427/397.7; 427/444
[58] Field of Search ............................ 427/444, 397.7

[56] References Cited

U.S. PATENT DOCUMENTS

| | | | |
|---|---|---|---|
| 3,512,950 | 5/1970 | Long | 65/182 |
| 4,474,831 | 10/1984 | Downey | 427/444 |
| 5,213,670 | 5/1993 | Bertagnolli et al. | 427/397.7 |

FOREIGN PATENT DOCUMENTS 0051940  5/1982  European Pat. Off. .

OTHER PUBLICATIONS

Patent Abstracts of Japan, vol. 015, No. 036 (E-1027) 29 Jan. 1991.

*Primary Examiner*—Janyce Bell
*Attorney, Agent, or Firm*—Kirschstein, Ottinger, Israel & Schiffmiller

[57] ABSTRACT

In a process and apparatus for annealing a substance, such as polysilicon, which is deposited on a substrate, such as a glass plate, the annealing temperature is required to be greater than the softening temperature of the substrate. To prevent deformation of the substrate it is supported on a liquid of density greater than that of the substrate. The liquid is preferably molten tin.

8 Claims, 2 Drawing Sheets

ANNEALING PROCESS

BACKGROUND OF THE INVENTION

1 Field of the Invention

This invention relates to an anealing process and apparatus, and particularly to a process and apparatus for annealing a substance, such as polysilicon, which has been deposited on a substrate made of glass or other heat-softenable material.

2. Description of the Related Art

In the fabrication of semiconductor devices, such as thin film transistors, polysilicon or other semiconductor material is deposited on a glass substrate, and is then subjected to annealing. Since the softening point of the glass which is conventionally used for forming the substrate is no more than 630° C., it will be apparent that It has always been essential to maintain the annealing temperature below that level, or the substrate would soften and become misshapen.

SUMMARY OF THE INVENTION

It is an object of the present Invention to provide an annealing process and apparatus in which the annealing temperature can be raised to a level appreciably in excess of the softening temperature of the substrate material.

According to one aspect of the invention there is provided a process for annealing a substance deposited on a substrate, in which the substrate is supported on a liquid having a density greater than the density of the substrate material; and in which the temperature of the substrate and the substance deposited thereon is raised to an annealing temperature which is higher than the softening temperature of the substrate material but lower than the boiling point of the liquid.

According to another aspect of the invention there is provided apparatus for annealing a substance deposited on a substrate, comprising a bath containing a liquid having a density greater than the density of the substrate material, on which liquid the substrate is supported; and means to raise the temperature of the substrate and the substance deposited thereon to an annealing temperature which is higher than the softening temperature of the substrate material but lower than the boiling point of the liquid.

Preferably the liquid is a molten metal or alloy having a melting point which is lower than the softening point of the substrate material. The metal may be, for example, tin, zinc or lead.

The deposited substance may be, for example, polysilicon.

Preferably, a protective layer formed of, for example, silicon dioxide is provided over the deposited substance to protect that layer during the annealing operation.

BRIEF DESCRIPTION OF THE DRAWINGS

Embodiments of the invention will now be described, by way of example, with reference to the accompanying drawing, in which.

DETAILED DESCRIPTION OF THE PREFERRED EMBODIMENTS

Figure 1:
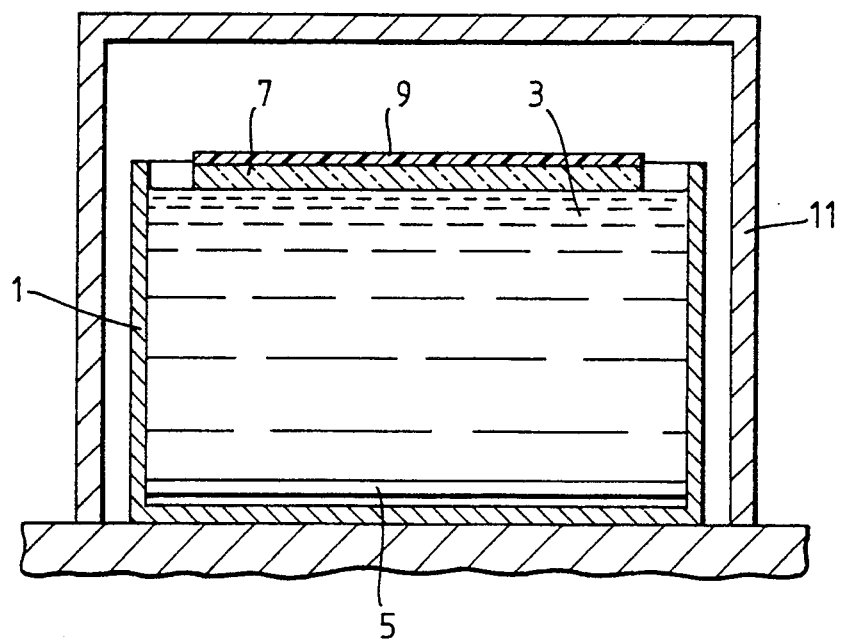
FIG. 1 is a schematic cross-sectional view illustrating a first example of apparatus in accordance with the invention.

Referring to FIG. 1 of the drawing, a bath 1 contains a quantity of tin 3 which is maintained in a molten state by an electrical heater 5. A glass substrate 7, on which is deposited a layer 9 of polysilicon, is supported by the molten tin. The bath is enclosed in a furnace 11 which is used to raise the temperature of the substrate and the polysilicon to, for example, 850° C., in order to anneal the polysilicon. The furnace 11 is evacuated or contains an inert atmosphere. The pressure in the furnace may be, for example, $5 \times 20^{-5}$ Torr.

It will be appreciated that this temperature is considerably higher than the softening temperature of the glass. However, the substrate is supported by the molten tin, and therefore retains its original shape and flatness.

Figure 2:
FIGS. 2 and 3 are enlarged micrographs of regions of polysilicon films which have been annealed at just below 630° C. and at 850° C., respectively.

The high-temperature annealing of the polysilicon greatly improves its grain structure. FIG. 2 is an enlarged micrograph of a region of a polysilicon film which has been annealed for 12 hours at a temperature Just less than 630° C., the softening point of the glass substrate. The micrograph shows poor crystallites with many defects inside the grains.

Figure 3:

FIG. 3, on the other hand, shows a region of a polysilicon film which has been annealed for 12 hours at a temperature of 850° C. using the apparatus of the present invention. This shows a much improved polysilicon grain structure with fewer defects inside the grains.

Figure 4:
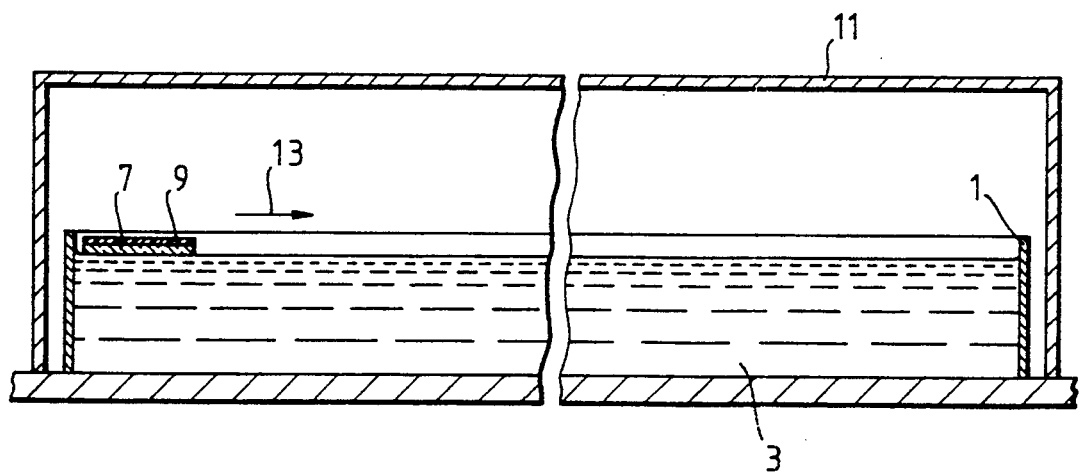
FIG. 4 is a schematic cross-sectional view of a second example of apparatus in accordance with the invention.

In an alternative apparatus shown in FIG. 4, the bath 1 and the furnace 11 are both extended lengthwise, and means (not shown) is provided to move the substrate 7, with the polysilicon layer 9 thereon, along the surface of the tin in the direction of an arrow 13. The environment inside the furnace is controlled such that the temperature at the left-hand end, where the substrate is loaded on to the surface of the tin, is below the softening point of the glass, but the temperature increases gradually towards the right, so that the full annealing temperature (e.g. 850° C.) is reached near the middle of the length of the furnace. The temperature then decreases from the middle towards the right-hand end of the furnace, so that by the time the substrate reaches the right-hand end the temperature of the glass has returned to below its softening point. The substrate can then be removed from the bath. This arrangement allows a batch of substrates to travel along the bath in sequence, thereby reducing the processing time for the batch.

Although in the above-described embodiments molten tin is used for supporting the glass substrate, other liquid materials may be used, provided that (a) they have a higher density than the glass, and (b) their boiling point is higher than the required annealing temperature, Other metals, such as zinc and lead may, in particular, be suitable, Suitable alloys may alternatively be used, The polysilicon film may be deposited on the substrate either before the substrate is introduced into the bath, or while the substrate is in the bath.

In order to protect the polysilicon layer, a layer of, for example, silicon dioxide may be formed over the polysilicon before the temperature of the polysilicon is raised to the annealing temperature.

The invention is applicable to other deposited substances besides polysilicon. Furthermore, it is applicable to other substrate materials which soften at temperatures below a required annealing temperature.

Besides the above-described advantage of allowing high-temperature annealing of polysilicon deposited on a glass substrate, the use of a bath containing molten tin also offers other advantages. Thus, due to the very good thermal contact between the liquid tin and the glass, substantially no temperature gradient exists at the surface of the glass. The substrate may be of any desired shape and size, limited only by the size of the bath. The tin does not wet the glass, and consequently it is very easy to remove the substrate from the bath.

I claim:

1. A process of annealing an annealable substance deposited on a substrate constituted of a heat-softenable material that has a density and softens at a softening temperature, comprising the steps of: supporting the substrate on a liquid having a boiling point and a density greater than the density of the substrate material; and raising the temperature of the substrate and the substance deposited thereon to an annealing temperature which is higher than the softening temperature of the substrate material but lower than the boiling point of the liquid.

2. A process as claimed in claim 1, wherein the liquid is one of a molten metal and an alloy having a melting temperature which is lower than the softening temperature of the substrate material.

3. A process as claimed in claim 2, wherein the metal is selected from the group consisting of tin, zinc and lead.

4. A process as claimed in claim 1, wherein the substance deposited on the substrate is polysilicon.

5. A process as claimed in claim 4, and the step of covering the polysilicon with a protective layer that resists contact between the polysilicon and the liquid, before performing the step of raising the temperature of the polysilicon to the annealing temperature.

6. A process as claimed in claim 5, wherein the protective layer is silicon dioxide.

7. A process as claimed in claim 1, and the step of moving the substrate along an upper surface of the liquid to successively hotter regions until the annealing temperature is reached, and then to successively cooler regions until the substrate material is below its softening temperature.

8. A process as claimed in claim 1, wherein the substrate material is glass.

* * * * *